(12) United States Patent
Chen

(10) Patent No.: US 10,515,596 B2
(45) Date of Patent: Dec. 24, 2019

(54) DISPLAY APPARATUS

(71) Applicant: E Ink Holdings Inc., Hsinchu (TW)

(72) Inventor: Wei-Tsung Chen, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 37 days.

(21) Appl. No.: 16/008,036

(22) Filed: Jun. 14, 2018

(65) Prior Publication Data

US 2019/0080654 A1   Mar. 14, 2019

(30) Foreign Application Priority Data

Sep. 12, 2017  (CN) .......................... 2017 1 0816385

(51) Int. Cl.
| | | |
|---|---|---|
| G09G 3/34 | (2006.01) | |
| G02F 1/167 | (2019.01) | |
| H01L 27/12 | (2006.01) | |
| G09G 3/36 | (2006.01) | |
| G02F 1/1368 | (2006.01) | |
| G02F 1/1676 | (2019.01) | |

(52) U.S. Cl.
CPC ........... *G09G 3/344* (2013.01); *G02F 1/1368* (2013.01); *G02F 1/167* (2013.01); *G09G 3/3677* (2013.01); *G09G 3/3688* (2013.01); *H01L 27/124* (2013.01); *G02F 1/1676* (2019.01); *G02F 2201/123* (2013.01)

(58) Field of Classification Search
USPC ...... 345/107, 60, 68, 76, 204, 206, 212, 213
See application file for complete search history.

(56) References Cited

U.S. PATENT DOCUMENTS

| | | | |
|---|---|---|---|
| 7,106,309 B2 | 9/2006 | Wood et al. | |
| 7,205,990 B2 | 4/2007 | Ishiyama | |
| 8,866,802 B2 | 10/2014 | Yamauchi | |
| 9,614,258 B2* | 4/2017 | Takahashi | H01M 10/48 345/68 |
| 2004/0113903 A1* | 6/2004 | Mikami | G09G 3/344 345/204 |
| 2005/0116887 A1* | 6/2005 | Lee | G09G 3/2965 345/60 |
| 2005/0162354 A1 | 7/2005 | Osame et al. | |
| 2005/0200562 A1* | 9/2005 | Lee | G09G 3/2965 345/60 |
| 2005/0248512 A1* | 11/2005 | Vossen | G09G 3/3216 345/76 |
| 2006/0007217 A1 | 1/2006 | Kanbe et al. | |
| 2006/0103605 A1* | 5/2006 | Choi | G09G 3/2965 345/68 |
| 2007/0040767 A1* | 2/2007 | Shim | G09G 3/2927 345/68 |
| 2007/0046580 A1* | 3/2007 | Kwon | G09G 3/2965 345/68 |

(Continued)

FOREIGN PATENT DOCUMENTS

| | | |
|---|---|---|
| CN | 1723484 | 1/2006 |
| CN | 102023434 | 4/2011 |

*Primary Examiner* — Thuy N Pardo
(74) *Attorney, Agent, or Firm* — JCIPRNET

(57) ABSTRACT

A display apparatus is provided. Conducting states of switches in a pixel are switched to change charges stored in electrical energy storage cells that are connected to the switches, so as to provide a multi-stage driving voltage to a pixel electrode without increasing the manufacturing cost and circuit area of the display apparatus.

9 Claims, 8 Drawing Sheets

(56) References Cited

U.S. PATENT DOCUMENTS

| | | | |
|---|---|---|---|
| 2011/0148853 A1* | 6/2011 | Ko | G09G 3/3677 345/213 |
| 2012/0019503 A1 | 1/2012 | Lee | |
| 2013/0033479 A1* | 2/2013 | Zebedee | G09G 3/3648 345/212 |
| 2015/0103063 A1* | 4/2015 | Ye | G09G 3/3648 345/212 |
| 2016/0035287 A1* | 2/2016 | Merkin | G09G 3/3611 345/205 |
| 2016/0085132 A1 | 3/2016 | Telfer et al. | |

\* cited by examiner

DISPLAY APPARATUS

CROSS-REFERENCE TO RELATED APPLICATION

This application claims the priority benefit of China application serial no. 201710816385.2, filed on Sep. 12, 2017. The entirety of the above-mentioned patent application is hereby incorporated by reference herein and made a part of this specification.

BACKGROUND OF THE INVENTION

1. Field of the Invention

The invention relates to a display apparatus and particularly relates to a display apparatus capable of providing a multi-stage driving voltage.

2. Description of Related Art

Over the recent years, an electrophoretic display (EPD) panel has been widely applied to the production of electronic papers. Compared with a display having a backlight panel (such as a liquid crystal display), the electronic paper exhibits similar visual feelings to papers. Readers feel comfortable to read the electronic paper, so the electrophoretic display panel is widely applied to a panel structure of an electronic book. Moreover, only when what is displayed is changed does the electrophoretic display panel require electricity. Therefore, the electrophoretic display panel is superior to other conventional displays in terms of energy efficiency.

The electrophoretic display panel performs the display function through an electrophoresis fluid and charged particles dispersed in the electrophoresis fluid. Applying voltages propels the movement of the charged particles in the electrophoresis fluid, allowing the electrophoretic display panel to display the color of the charged particles or background. It requires the multi-stage driving voltage for a multi-particle colorful electrophoretic display panel to display the color. The multiple voltage is usually produced by source driver IC chips that outputs the multi-stage voltage. However, one of the disadvantages of adopting the approach is that the cost of production is high, and a chip area becomes larger, which places an unfavorable influence on the application of small articles (such as a label).

SUMMARY OF THE INVENTION

The invention is directed to a display apparatus capable of providing a multi-stage driving voltage without increasing the manufacturing cost and circuit area of the display apparatus.

The display apparatus according to an embodiment of the invention includes a scan line driving circuit, a data line driving circuit and a plurality of pixels. The pixels are disposed at junctions of a corresponding data line and a plurality of corresponding scan lines. Each of the data lines may provide a p-stage data voltage, each of the pixels includes q switches and q electrical energy storage cells. The numbers p and q are integers that are greater than 1. The q switches are connected between the corresponding data line and a pixel electrode. A control end of the respective switches is coupled to the corresponding scan line. A collective joint point between the two adjacent switches is coupled to a first end of the corresponding electrical energy storage cell, the pixel electrode is coupled to the first end of the corresponding electrical energy storage cell, a second end of the respective electrical energy storage cells is coupled to the ground, and the switch that is coupled to the pixel electrode is configured to provide the multi-stage driving voltage to the pixel electrode.

In one embodiment of the invention, each of the pixels includes a first electrical energy storage cell, a second electrical energy storage cell, a first switch and a second switch. A first end of the first switch is coupled to a corresponding data line, a control end of the first switch is coupled to a first scan line, and the first electrical energy storage cell is coupled between a second end of the first switch and the ground. A first end of the second switch is coupled to the second end of the first switch, a control end of the second switch is coupled to a second scan line, a second end of the second switch is coupled to the pixel electrode, the second electrical energy storage cell is coupled between the second end of the second switch and the ground, and the second end of the second switch is configured to output the multi-stage driving voltage.

In one embodiment of the invention, during a driving period of the pixel electrode, a conducting period of the second switch is equal to or greater than a conducting period of the first switch.

In one embodiment of the invention, a period when the first switch is conducted overlaps with a period when the second switch is conducted.

In one embodiment of the invention, during the driving period of the pixel electrode, a cross voltage on the first electrical energy storage cell and the second electrical energy storage cell is charged to be equal to a data voltage provided by the corresponding data line.

In one embodiment of the invention, the second switch is firstly conducted before the first switch and the second switch are conducted at the same time.

In one embodiment of the invention, the first switch and the second switch are conducted sequentially, the first switch and the second switch are conducted at different times, the cross voltage on the first electrical energy storage cell is charged to be equal to the data voltage provided by the corresponding data line during the period when the first switch is conducted firstly, the first electrical energy storage cell shares a charge with the second electrical energy storage cell during the period when the second switch is conducted such that the cross voltage on the first electrical energy storage cell and the second electrical energy storage cell is equal to half of the data voltage provided by the corresponding data line.

In one embodiment of the invention, each of the data lines may provide a three-stage data voltage, and the multi-stage driving voltage is a five-stage driving voltage.

In one embodiment of the invention, the first switch includes a first transistor, and the second switch includes a second transistor.

In one embodiment of the invention, the first electrical energy storage cell includes first capacitance, and the second electrical energy storage cell includes second capacitance.

In one embodiment of the invention, the display apparatus includes an electrophoretic display.

In view of the foregoing, the exemplary embodiments of the invention suggest that conducting states of the switches in the pixel are switched to change charges stored in the electrical energy storage cells connected to the switches, so as to provide the multi-stage driving voltage to the pixel electrode without increasing the manufacturing cost and circuit area of the display apparatus.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
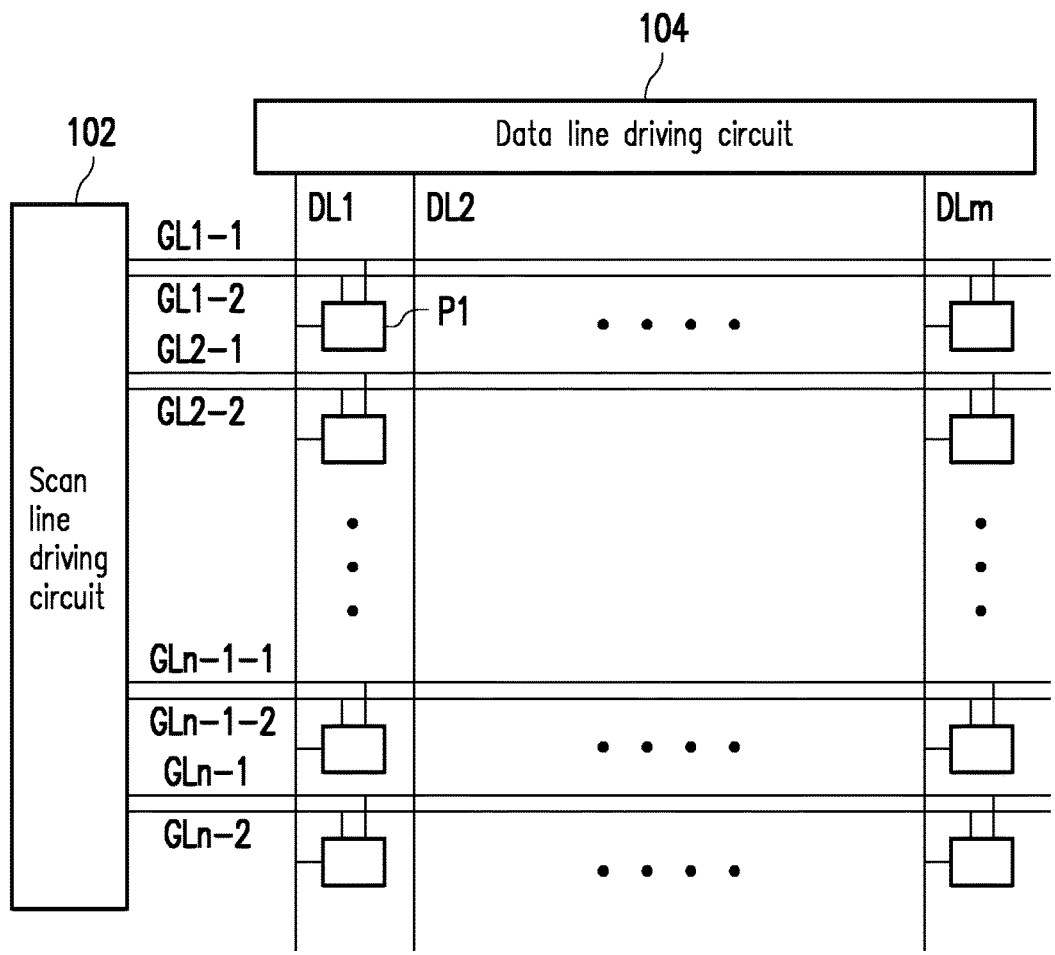
FIG. 1 is a schematic view illustrating a display apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic view illustrating a display apparatus according to an embodiment of the invention. Please refer to FIG. 1. The display apparatus may include an electrophoretic display or liquid crystal display, but is not limited thereto. The display apparatus may include a scan line driving circuit 102, a data line driving circuit 104 and a plurality of pixels P1. Each of the pixels P1 is disposed at a junction of a corresponding data line and a plurality of corresponding scan lines. For instance, in an embodiment of the invention, a pixel P1 corresponds to one data line and two scan lines, like the situation where the pixel P1 in line 1 and row 1 is coupled to a data line DL1 and scan lines GL1-1 and GL1-2, the pixel P1 in line 1 and row 2 is coupled to the data line DL1 and scan lines GL2-1 and GL2-2, and the rest of the pixels P1 follow suit. Details are not repeated here. The scan line driving circuit 102 is configured to drive scan lines GL1-1 to GLn-2, and the data line driving circuit 104 is configured to drive data lines DL1 to DLm. N is an integer that is greater than 1, and m is a positive integer.

Figure 2:
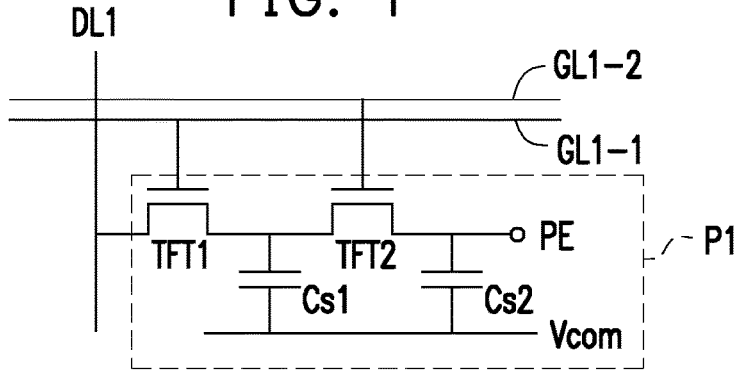
FIG. 2 is a schematic view illustrating a pixel according to an embodiment of the invention.

Further, each of the pixels may include a plurality of switches and electrical energy storage cells. For instance, FIG. 2 is a schematic view illustrating the pixel according to an embodiment of the invention. Please refer to FIG. 2. The pixel P1 in line 1 and row 1 in the embodiment of FIG. 2 is taken as an example to specify that the pixel P1 includes switches TFT1 and TFT2 and electrical energy storage cells Cs1 and Cs2. The switches TFT1 and TFT2 may be implemented as transistors (like thin-film transistors), for example, and the electrical energy storage cells Cs1 and Cs2 may be implemented as capacitance, for example; however, the inventions are not limited thereto. A first end of the switch TFT1 is coupled to the corresponding data line DL1, a control end of the switch TFT1 is coupled to the scan data line GL1-1, the electrical energy storage cell Cs1 is coupled between a second end of the switch TFT1 and ground Vcom. The first end of the switch TFT2 is coupled to the second end of the switch TFT1, the control end of the switch TFT2 is coupled to the scan line GL1-2, a second end of the switch TFT2 is coupled to a pixel electrode PE, and the electrical energy storage cell Cs2 is coupled between the second end of the switch TFT2 and the ground Vcom.

Figure 3:
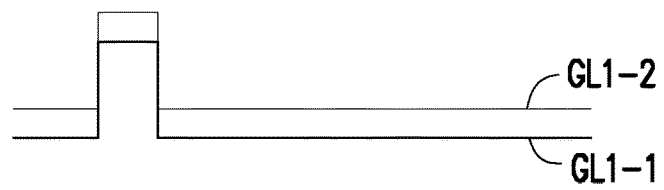
FIG. 3 is an oscillogram illustrating a driving signal of a scan line according to an embodiment of the invention.

The data line driving circuit 104 may drive the data line DL1 and allow the data line DL1 to provide three stages of data voltages such as three different data voltages of −Vd, 0 and Vd. The way how the scan line driving circuit 102 drives the scan lines GL1-1 and GL1-2 may be as shown in an oscillogram of FIG. 3 illustrating driving signals of the scan lines GL1-1 and GL1-2. The scan lines GL1-1 and GL1-2 (a circuit is conducted when a signal waveform is at a high logic level) are driven at the same time to conduct the switches TFT1 and TFT2, allowing the data voltage to charge the electrical energy storage cells Cs1 and Cs2 and conducting the second end (or the electrical energy storage cell Cs2) of the switch TFT2 to produce the voltage Vd and provide the voltage Vd to the pixel electrode PE.

Figure 4:
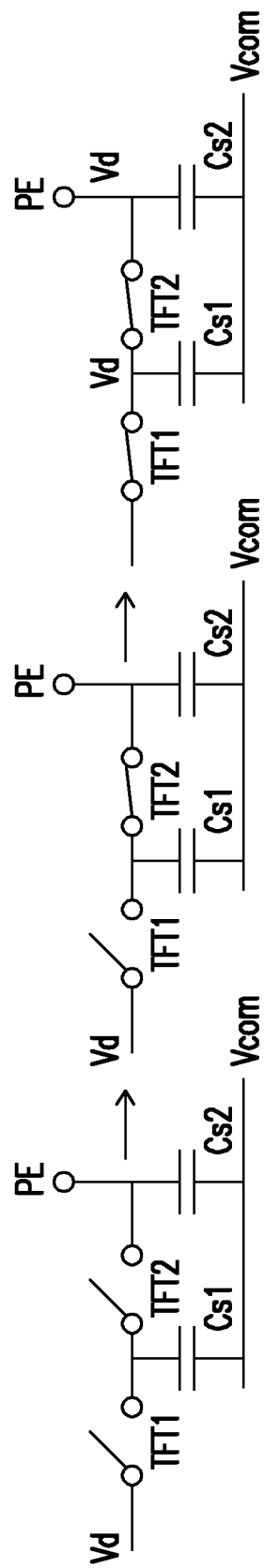
FIG. 4 is a schematic view illustrating the switch of a switch in a pixel according to an embodiment of the invention.

FIG. 4 is a schematic view illustrating the switch of a switch in the pixel according to an embodiment of the invention. Please refer to FIG. 4. In the embodiment, the pixel P1 in line 1 and row 1 is taken as an example for description. The way that the scan line driving circuit 102 drives the scan lines GL1-1 and GL1-2 is that the scan line driving circuit 102 firstly drives and continues driving the scan line GL1-2 and then drives the scan line GL1-1 at the same time. As shown in FIG. 4, in this way, the switch TFT2 is firstly conducted, and after charges stored in the electrical energy storage cells Cs1 and Cs2 are balanced, the switch TFT1 is further conducted to charge a cross voltage on the electrical energy storage cells Cs1 and Cs2 to the voltage Vd that is equal to the data voltage provided by the data line DL1.

Figure 5:
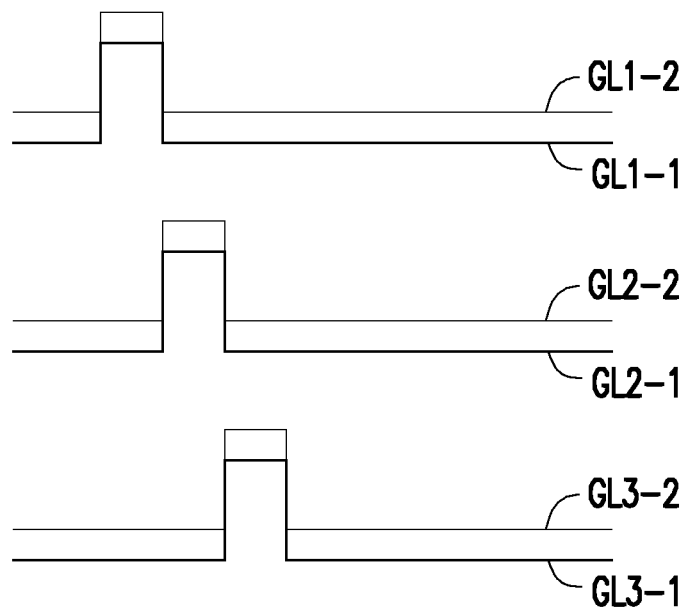
FIGS. 5 to 7 are oscillograms illustrating a driving signal of a scan line according to embodiments of the invention.
Figure 6:
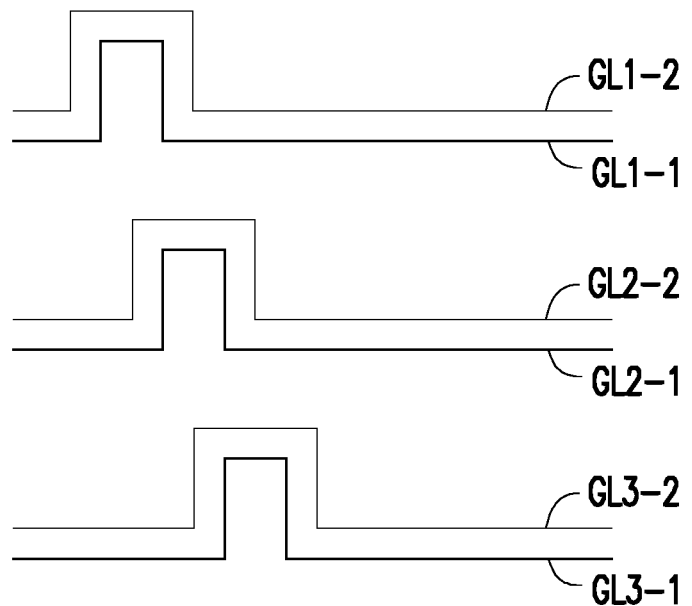
Figure 7:

FIGS. 5-7 are oscillograms of the driving signals of the scan lines according to embodiments of the invention. As shown in FIG. 5, the scan line driving circuit 102 may drive the scan lines of the display apparatus sequentially, meaning firstly driving the scan lines GL1-1 and GL1-2 at the same time and then driving the scan lines GL2-1 and GL2-2 at the same time and then driving scan lines GL3-1 and GL3-2 at the same time.

In an embodiment in FIG. 6, during a driving period of each of the pixel electrodes PE, a conducting period of the switch TFT2 is greater than a conducting period of the switch TFT1, so the switch TFT2 is conducted firstly with the switch TFT1 conducted later to firstly balance the charges stored in the electrical energy storage cells Cs1 and Cs2 and then charge the electrical energy storage cells Cs1 and Cs2.

It is noteworthy that the switches TFT1 and TFT2 in the respective pixels P1 could lead to a difference between the conducting periods of the switches TFT1 and TFT2 and the expected conducting periods because of process variation, circuit design, noise interference or other factors. To ensure the switch TFT2 is conducted earlier than the switch TFT1, the scan line driving circuit 102 may also drive the scan lines GL1-1 to GL3-2 in the manner as shown in the embedment in FIG. 7. That is, during the conducting period of each of the pixel electrodes PE, the switch TFT2 remains in a conducting state. This way ensures the switch TFT2 is conducted earlier than the switch TFT1, no matter when the conducting time of the switch TFT1 is.

Figure 8:
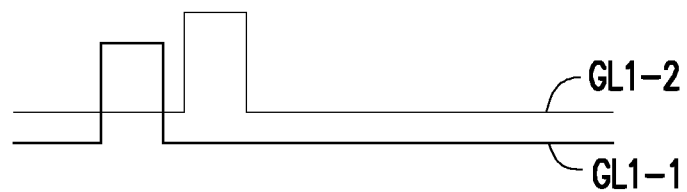
FIG. 8 is an oscillogram illustrating a driving signal of a scan line according to another embodiment of the invention.
Figure 9:
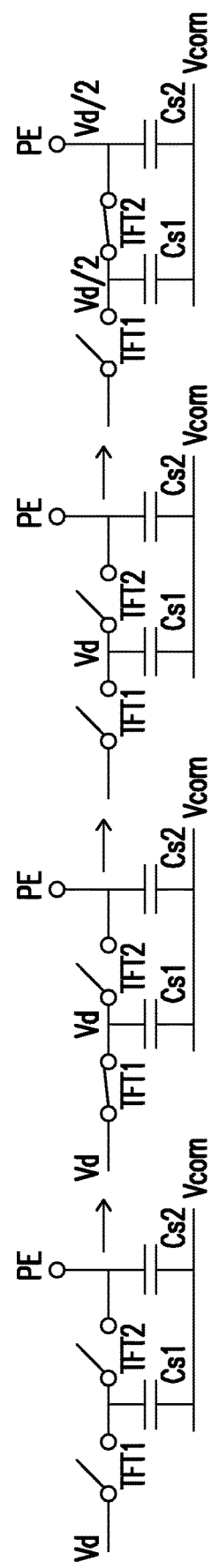
FIG. 9 is a schematic view illustrating a switch of a pixel conducted by using the driving signal according to the embodiment of FIG. 8.

FIG. 8 is an oscillogram of the driving signals of the scan lines of another embodiment of the invention, and FIG. 9 is a schematic view illustrating the switches of the pixels conducted by using the driving signals illustrated in the embodiment of FIG. 8. Please refer to FIGS. 8 and 9 in the meanwhile. In the embodiments in FIGS. 8 and 9, the pixel P1 in line 1 and row 1 is taken as example for description. The scan line driving circuit 102 may firstly conduct the switch TFT1 and then the switch TFT2. The switches TFT1 and TFT2 are not conducted in the meanwhile, so the cross voltage on the electrical energy storage cell Cs1 is charged to be equal to the data voltage (presumed to be the voltage Vd) provided by the data line DL1 during the conducting period of the pixel electrode PE. After the switch TFT1 is switched to be in a non-conducting state, the scan line driving circuit 102 conducts the switch TFT2, and the electrical energy storage cell Cs1 shares a charge with the electrical energy storage cell Cs2 during a period when the switch TFT2 is conducted, so the cross voltage on the electrical energy storage cells Cs and Cs2 is equal to half of the data voltage (equal to half of the voltage Vd) provided by the data line DL2.

Figure 10:
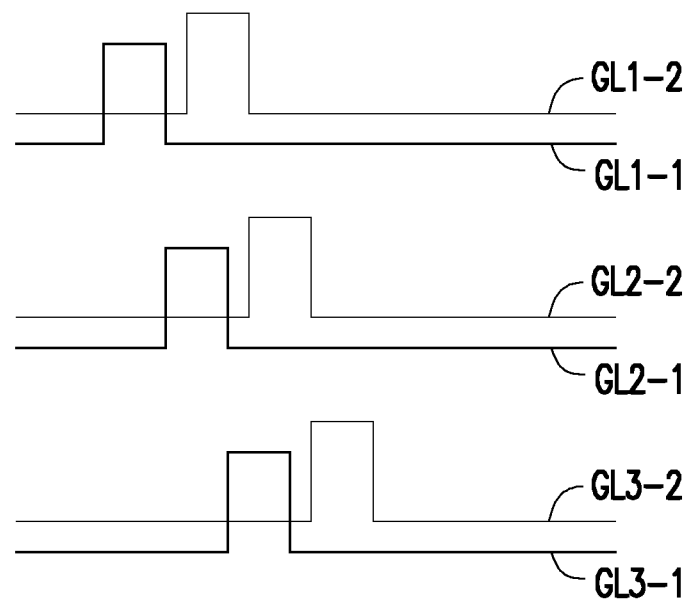
FIGS. 10 to 12 are oscillograms illustrating a driving signal of a scan line according to embodiments of the invention.
Figure 11:
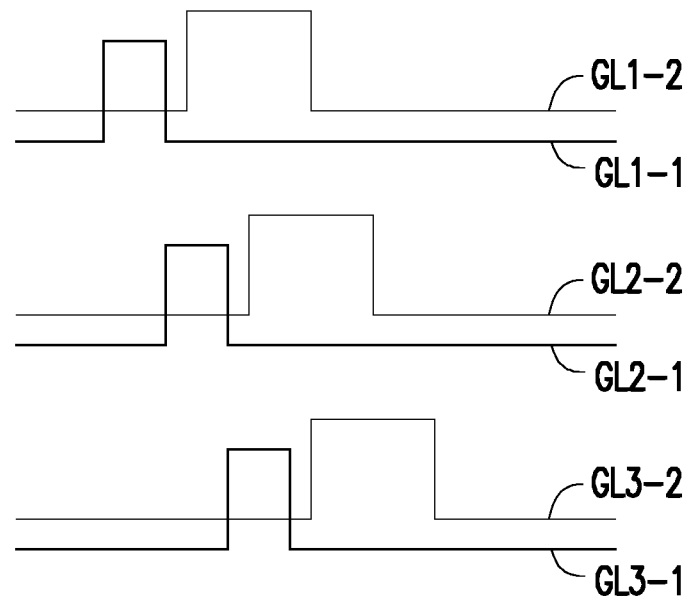
Figure 12:
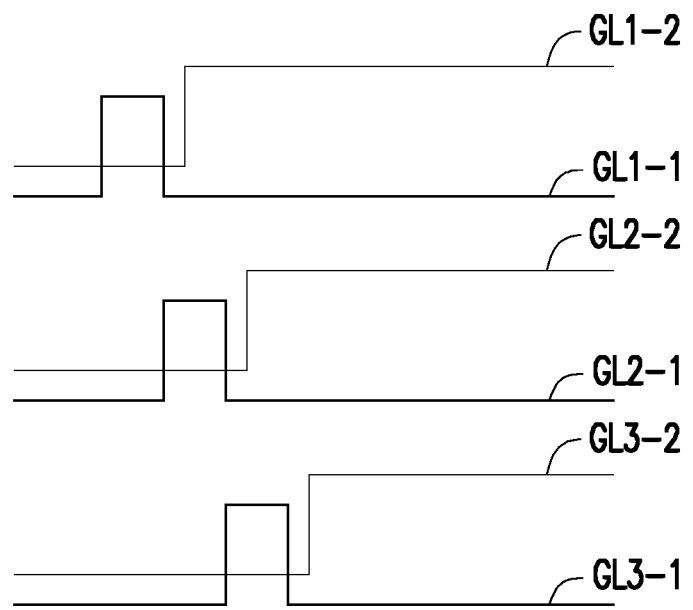

FIGS. 10 to 12 are oscillograms of the driving signals of the scan lines according to embodiments of the invention. As shown in FIG. 10, the scan line driving circuit 102 may sequentially drive the pixel which every two scan lines correspond to. For instance, the scan line driving circuit 102 firstly drives the scan line GL1-2 corresponding to the pixel in row 1 and then the scan line GL1-1 corresponding to the pixel in row 1. Afterwards, the scan line driving circuit 102 drives the scan line GL2-2 corresponding to the pixel in row 2 firstly and then the scan line GL2-1 corresponding to the pixel in row 2. The scan lines GL3-1 and GL3-2 are also driven in a similar way.

In addition, the switches TFT1 and TFT2 in the respective pixels may lead to the difference between the conducting periods of the switches TFT1 and TFT2 and the expected conducting periods because of process variation, circuit design, noise interference or other factors. To ensure the electrical energy storage cell Cs1 has sufficient time to share the charge with the electrical energy storage cell Cs2, the scan line driving circuit 102 may also drive the scan lines GL1-1 to GL3-2 in the way as illustrated in the embodiments of FIG. 11 or 12. That is, the conducting period of the switch TFT2 in the embodiment of FIG. 10 is extended to allow sufficient time for the cross voltage on the electrical energy storage cells Cs1 and Cs2 to reach half of the data voltage (equal to half of the voltage Vd) provided by the data line DL2. For instance, in the embodiment in FIG. 11, the conducting period of the switch TFT2 may be greater than the conducting period of the switch TFT1. Alternatively, as shown in the embodiment in FIG. 12, the switch TFT2 is kept in a conducting state to allow sufficient time for the electrical energy storage cell Cs1 to share the charges with the electrical energy storage cell Cs2.

Switching the conducting states of the switches TFT1 and TFT2 in the pixel P1 changes the charges stored in the electrical energy storage cells Cs1 and Cs2 that are connected the switches TFT1 and TFT2, providing the multi-stage driving voltage to the pixel electrode PE. For instance, in a case where the data voltages of the three different voltages −Vd, 0 and Vd are provided, the driving voltages of five different voltages −Vd, half of −Vd, 0, half of Vd and Vd may be provided to the pixel electrode PE through the production way of the driving voltages as shown in the embodiments. Therefore, a driving chip capable of outputting the multi-stage voltage is not required to provide the driving voltage, preventing an increase in the manufacturing cost and circuit area of the display apparatus.

It is noteworthy that in some embodiments, it is also possible to regulate the charges stored in the electrical energy storage cells Cs1 and Cs2 by controlling the conducting times of the switches TFT1 and TFT2 to regulate the driving voltage. In other words, the driving voltage is not limited to be the voltages −Vd, half of −Vd, 0, half of Vd and Vd and instead may be designed to be any of the voltages −Vd to Vd. The driving voltage of 0 may be produced in the way of the embodiments in FIGS. 4 to 9. Besides, in some embodiments, if the provided driving voltage is to be changed from 0 to another number, the provided driving voltage may be firstly regulated to be 0 and then to be the desired voltage. For instance, if the provided driving voltage is to be changed from Vd to −Vd, the provided driving voltage may be firstly regulated from Vd to 0 and then from 0 to −Vd.

Figure 13:
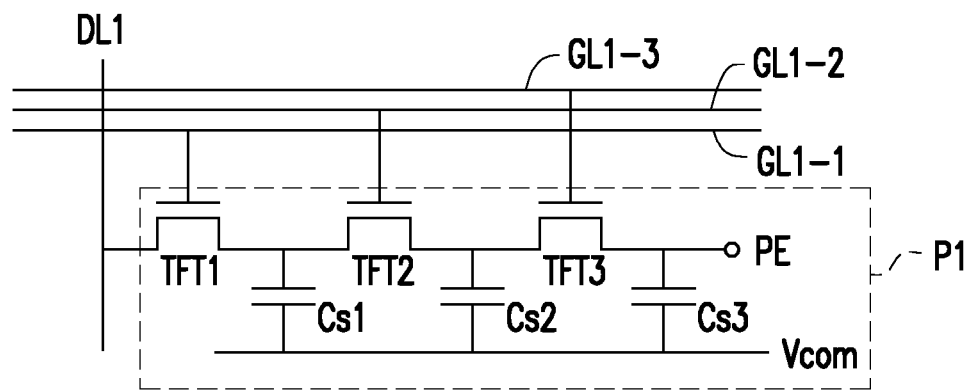
FIG. 13 is a schematic view illustrating a pixel according to another embodiment of the invention.

In addition, although all the embodiments demonstrate the example of the pixel P1 including two switches and two electrical energy storage cells, the numbers of the switches and the electrical energy storage cells that may be included by the pixel P1 are not limited to the embodiments. In other embodiments, it is also possible to adjust the numbers of the switches and the electrical energy storage cells that may be included by the pixel P1 based on the circumstances. In other words, the respective pixels may include q switches and q electrical energy storage cells, and q is an integer that is greater than 1. For instance, FIG. 13 is a schematic view illustrating the pixel according to another embodiment of the invention. Please refer to FIG. 13. In the embodiment, the pixel P1 may include the switches TFT1 to TFT3 and the electrical energy storage cells Cs1 to Cs3. The switches TFT1 to TFT3 are connected between the corresponding data line (i.e. the data line DL1 in the embodiment) and the corresponding pixel electrode PE. A collective joint point of two adjacent switches is coupled to a first end of corresponding electrical energy storage cells, the pixel electrode PE is coupled to a first end of the corresponding electrical energy storage cell Cs3, and second ends of the electrical energy storage cells Cs1 to Cs3 are coupled to the ground Vcom. The scan line driving circuit 102 may switch the conducting states of the switches TFT1 to TFT3 in the manner illustrated in the embodiment. Through the production manner of the driving voltage illustrated in the embodiment, the driving voltages of seven different voltages may be provided to the pixel electrode PE. Since the embodiment details how the switches are switched through examples, persons having ordinary skill in the art may imagine how the embodiment is carried out, and redundant description is needless. Besides, the data voltages that may be provided by the respective data lines are not limited to the three stages of voltages in the embodiment. The respective data lines may provide a p stage of the data voltage, and p is an integer that is greater than 1.

In view of the foregoing, the exemplary embodiments of the invention demonstrate that by switching the conducting states of the switches in the pixels, the charges stored in the electrical energy storage cells that are connected to the switches are changed to provide the multi-stage driving voltage to the pixel electrode, and the source driver IC chip capable of outputting the multi-stage voltage is not required to provide the multi-stage driving voltage, preventing an increase in the manufacturing cost and circuit area of the display apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display apparatus, comprising:
   a scan line driving circuit;
   a data line driving circuit; and
   a plurality of pixels, disposed at junctions of a corresponding data line and a plurality of corresponding scan lines respectively, wherein each of the data lines provides a p stage of a data voltage, each of the pixels comprising:
      q switches, connected between the corresponding data line and a pixel electrode, wherein a control end of the switch is coupled to the corresponding scan line, wherein the q switches comprise a first switch and a second switch; and
      q electrical energy storage cells, wherein a collective joint point of two adjacent switches is coupled to a first end of the corresponding electrical energy storage cell, the pixel electrode is coupled to the first end of the corresponding electrical energy storage cell, a second end of each of the electrical energy storage cells is coupled to the ground, and the switch coupled to the pixel electrode is configured to provide a multi-stage driving voltage to the pixel electrode, wherein p and q are integers that are greater than 1, wherein the q electrical energy storage cells comprise a first electrical energy storage cell and a second electrical energy storage cell, wherein
   a first end of the first switch is coupled to a corresponding data line, a control end of the first switch is coupled to a first scan line, and the first electrical energy storage cell is coupled between a second end of the first switch and the ground,
   a first end of the second switch is coupled to the second of the first switch, a control end of the second switch is coupled to a second scan line, a second end of the second switch is coupled to the pixel electrode, the second electrical energy storage cell is coupled between the second end of the second switch and the ground, and the second end of the second switch is configured to output the multi-stage driving voltage, wherein
   during a driving period of the pixel electrode, a conducting period of the second switch is equal to or greater than a conducting period of the first switch.

2. The display apparatus according to claim 1, wherein a period when the first switch is conducted overlaps with a period when the second switch is conducted.

3. The display apparatus according to claim 2, wherein during the driving period of the pixel electrode, a cross voltage on the first electrical energy storage cell and the second electrical energy storage cell is charged to be equal to a data voltage provided by the corresponding data line.

4. The display apparatus according to claim 2, wherein the second switch is firstly conducted before the first switch and the second switch are conducted at the same time.

5. The display apparatus according to claim 1, wherein the first switch and the second switch are conducted sequentially, the first switch and the second switch are conducted at different times, a cross voltage on the first electrical energy storage cell is charged to be equal to the data voltage provided by the corresponding data line during the period when the first switch is conducted, and the first electrical energy storage cell shares a charge with the second electrical energy storage cell during the period when the second switch is conducted such that the cross voltage on the first electrical energy storage cell and the second electrical energy storage cell is equal to half of the data voltage provided by the corresponding data line.

6. The display apparatus according to claim 1, wherein each of the data lines provides a three-stage data voltage, and the multi-stage driving voltage is a five-stage driving voltage.

7. The display apparatus according to claim 1, wherein the first switch comprises a first transistor, and the second switch comprises a second transistor.

8. The display apparatus according to claim 1, wherein the first electrical energy storage cell comprises first capacitance, and the second electrical energy storage cell comprises second capacitance.

9. The display apparatus according to claim 1, wherein the display apparatus comprises an electrophoretic display.

* * * * *